(12) United States Patent
Liao et al.

(10) Patent No.: US 11,131,541 B2
(45) Date of Patent: Sep. 28, 2021

(54) SHUTTER MONITORING SYSTEM

(71) Applicant: Taiwan Semiconductor Manufacturing Co., Ltd., Hsinchu (TW)

(72) Inventors: Shih-Yu Liao, Hsinchu (TW); Shih-Chi Kuo, Yangmei (TW); Tsai-Hao Hung, Hsinchu (TW); Tsung-Hsien Lee, Tainan (TW)

(73) Assignee: Taiwan Semiconductor Manufacturing Co., Ltd.

( * ) Notice: Subject to any disclaimer, the term of this patent is extended or adjusted under 35 U.S.C. 154(b) by 52 days.

(21) Appl. No.: 16/407,799

(22) Filed: May 9, 2019

(65) Prior Publication Data

US 2020/0003550 A1    Jan. 2, 2020

Related U.S. Application Data

(60) Provisional application No. 62/692,231, filed on Jun. 29, 2018.

(51) Int. Cl.
| | | |
|---|---|---|
| *G01B 11/14* | (2006.01) |
| *G01N 21/956* | (2006.01) |
| *G01N 21/95* | (2006.01) |
| *G03B 19/00* | (2021.01) |
| *G03F 7/30* | (2006.01) |
| *H01L 21/67* | (2006.01) |

(Continued)

(52) U.S. Cl.
CPC ........ *G01B 11/14* (2013.01); *G01N 21/9501* (2013.01); *G01N 21/956* (2013.01); *G03B 9/08* (2013.01); *G03B 19/00* (2013.01); *G03F 7/3028* (2013.01); *G03F 7/70616* (2013.01); *H01L 21/67155* (2013.01)

(58) Field of Classification Search
CPC ........ G01B 11/14; G01B 7/14; G01N 21/956; G01N 21/9501; G03B 19/00; G03F 7/3028; G03F 7/70616; H01L 21/67155; H01L 21/67126; H01L 21/6719; H01L 21/67259

See application file for complete search history.

(56) References Cited

U.S. PATENT DOCUMENTS 4,624,551 A * 11/1986 Anzai ................ G03F 7/70058
                                                                        355/53
6,077,321 A *  6/2000 Adachi ............. H01L 21/67028
                                                                        29/25.01

(Continued)

FOREIGN PATENT DOCUMENTS

CN    103869604 A    6/2014
TW    201400992 A    1/2014

*Primary Examiner* — Akm Zakaria

(74) *Attorney, Agent, or Firm* — Sterne, Kessler, Goldstein & Fox P.L.L.C.

(57) ABSTRACT

The present disclosure is directed to a method and system for monitoring a distance between a shutter and a reference point in a processing module. For example, the method includes moving a shutter relative to a substrate support in a wafer processing module and determining a distance between the shutter and a wall of the wafer processing module with a measurement device. In response to the distance being greater than a value, the method further includes transferring a substrate to the substrate support, and in response to the distance being equal to or less than the value, the method includes resetting the shutter.

20 Claims, 6 Drawing Sheets

(51) Int. Cl.
*G03B 9/08* (2021.01)
*G03F 7/20* (2006.01)

(56) References Cited

U.S. PATENT DOCUMENTS

| | | | | |
|---|---|---|---|---|
| 6,542,085 | B1 * | 4/2003 | Yang | G01S 15/931 |
| | | | | 340/903 |
| 9,653,259 | B2 | 5/2017 | Scheffers | |
| 2006/0284083 | A1 * | 12/2006 | Kurenuma | B82Y 35/00 |
| | | | | 250/309 |
| 2008/0097646 | A1 * | 4/2008 | Ramsey | H01L 21/67259 |
| | | | | 700/258 |
| 2009/0067959 | A1 * | 3/2009 | Takahashi | H01L 21/67766 |
| | | | | 414/226.01 |
| 2018/0158796 | A1 * | 6/2018 | Otsuka | H01L 21/67259 |

* cited by examiner

SHUTTER MONITORING SYSTEM

CROSS-REFERENCE TO RELATED APPLICATION

This application claims the benefit of U.S. Provisional Patent Application No. 62/692,231, titled "Monitor Device and Method," which was filed on Jun. 29, 2018 and is incorporated herein by reference in its entirety.

BACKGROUND

Production equipment used in semiconductor manufacturing can be a source of particles for wafers in an integrated circuit (IC) fabrication facility. During the wafer fabrication process, semiconductor waters undergo numerous processing operations. The number of particles on a wafer's surface can increase during IC fabrication as the wafer is exposed to additional processing.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
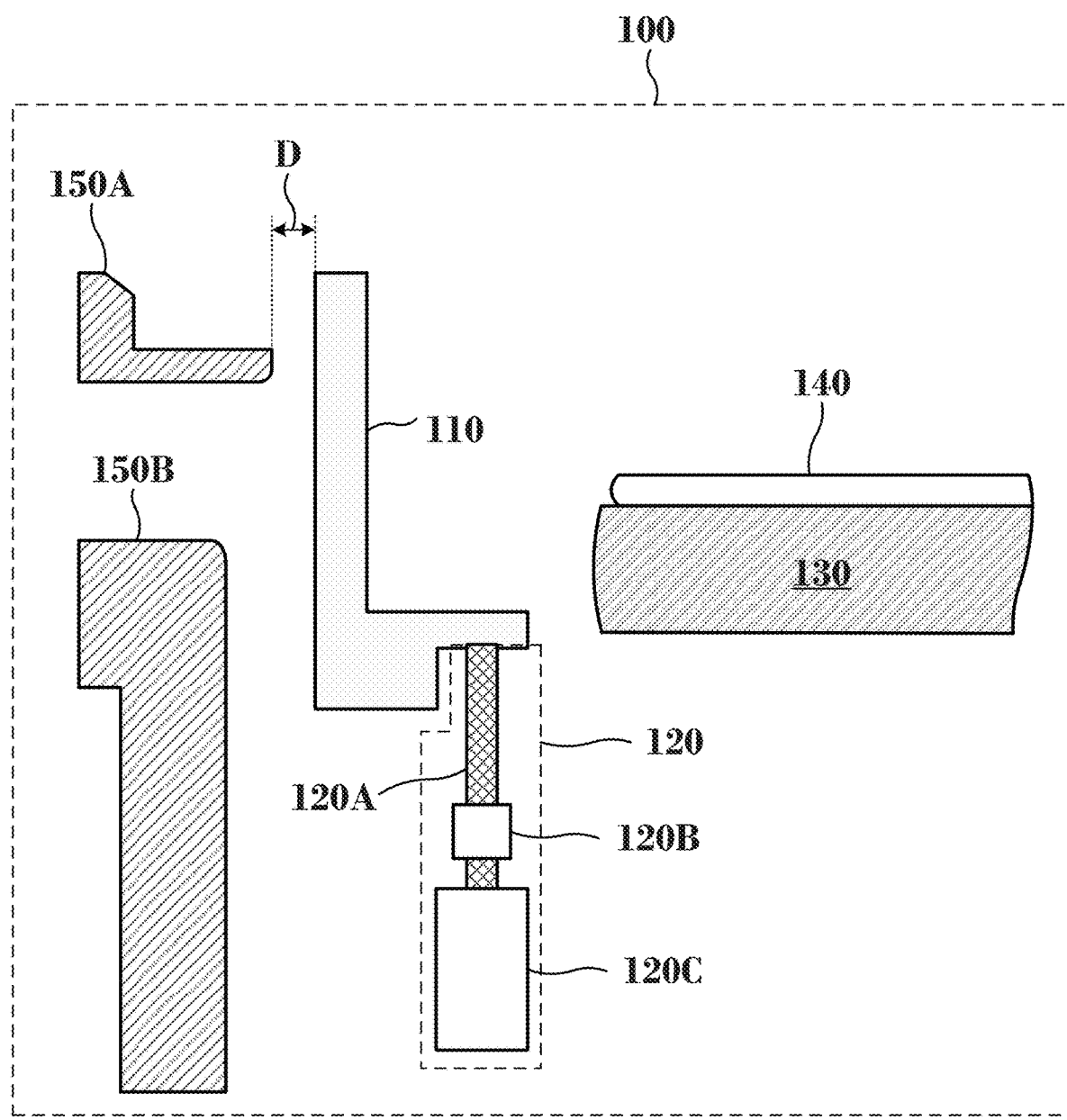
FIG. 1 is a partial view of a processing module with a shutter activated, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

Shutters provide a division of space within a processing module. For example, a first region of the divisible space can be occupied by a substrate support (e.g., a chuck), and a second region of the divisible space can be occupied by another component—from which the substrate support and/or the substrate (e.g. wafer) need to be shielded. Shutters can be activated or deactivated by changing their position relative to the position of the wafer and/or the substrate support. By way of example, a shutter can be activated when it is raised relative to the position of the wafer/substrate support. Conversely, a shutter can be deactivated when it is lowered relative to the position of the wafer/substrate support.

The movement of a shutter in a preferred direction can be controlled via a mechanical or electromechanical assembly that includes numerous components, such as rods, bearings, pneumatic cylinders, electronic controllers, pneumatic lines, power supplies, sensors, springs, etc. Continuous use of the shutter can wear the components of the assembly responsible for its movement. As a result, the shutter's movement can become less precise over time. For example, the moving shutter can slowly deviate from its path (e.g., become misaligned) and come into contact with (e.g., rub against) an adjacent component (e.g., a wall of the processing module). The contact can be subtle, but can be exacerbated as the shutter deviates more from its intended path. The unintentional contact between the shutter and the adjacent component can form scratches on the rubbing surfaces and can become a source of particles. These particles can migrate to the processed wafer and subsequently cause defects.

The embodiments described herein are directed to a preventative method and system that monitors the distance between a shutter and a reference point. The method and system described herein can be used to prevent unintentional contact between the shutter and an adjacent component due to a deviation in the shutter's movement.

FIG. 1 is a cross-sectional view of a portion of a processing module 100. Processing module 100 includes a shutter 110 that can be raised or lowered, via an assembly 120, relative to the position of a substrate support or chuck 130 and substrate or wafer 140. Processing module 100 can also include additional components that are not shown in FIG. 1. Such components include, but are not limited to, additional wall portions, openings, heaters, motors, valves, pumps, magnets, showerheads, collimators, robotic arms, gas delivery lines, sensors, electronic equipment, controllers, pump lines, and/or power supplies that can power different components of processing module 100. In some embodiments, processing module 100 is an etching module, a deposition module, a module in a semiconductor fabrication facility or other manufacturing facility that uses shutter 110.

In some embodiments, shutter 110 can move in a vertical direction along the z-axis. By way of example and not limitation, shutter 110 may be configured to separate two compartments of a cluster tool. For example, shutter 110 can block an opening used to transfer wafer 140 from one compartment to another compartment (e.g., processing module 100) of the cluster tool. When shutter 110 is raised, as shown in FIG. 1, it can be proximal to an upper wall portion 150A of processing module 100. A lower portion of the processing module's wall 150B is also shown in FIG. 1. Upper and lower wall portions 150A and 150B of processing module 100 are connected to portions of the processing module that are not shown in FIG. 1 for simplicity.

In some embodiments, assembly 120 includes a rod 120A, a bearing assembly 120B, and a cylinder 120C. Assembly 120 may include additional components, which are not shown in FIG. 1. Such components include, but are not limited to, pneumatic valves, motors, controllers, sensors, and/or other electronic components.

Figure 2:
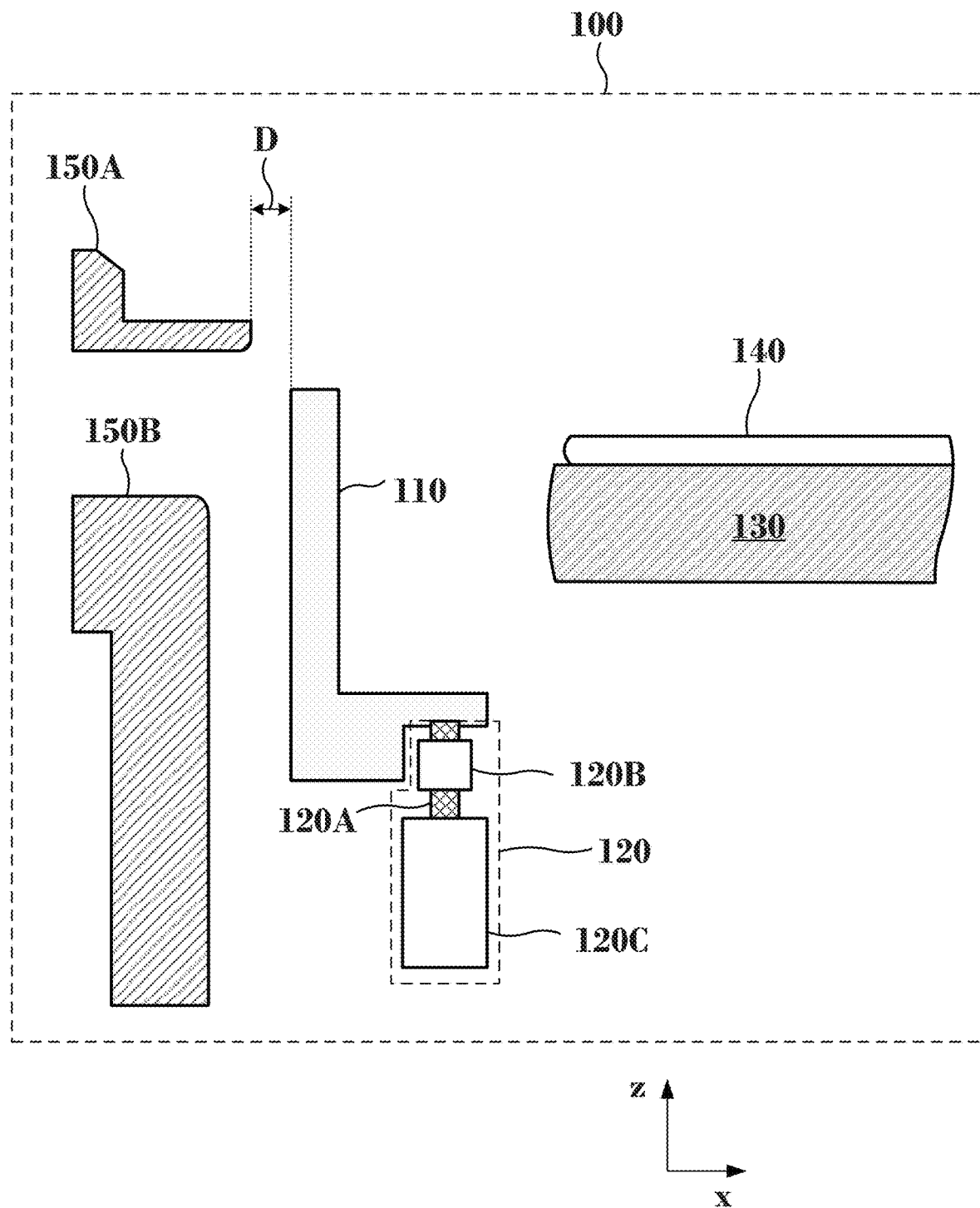
FIG. 2 is a partial view of a processing module with a shutter deactivated, according to some embodiments.

According to some embodiments, FIG. 2 shows shutter 110 in a lower position (than that of FIG. 1) relative to the position of chuck 130 and wafer 140. By way of example, shutter 110 can move between a low position (e.g., shown in FIG. 2) and a high position (e.g., shown in FIG. 1) at any point during a process performed in processing module 100. Additionally, shutter 110 can switch between the high and low positions (e.g., shown in FIGS. 1 and 2, respectively) while wafer 140 is in or out of processing module 100. The position of shutter 110 is not limited to the illustrations of FIGS. 1 and 2. For example, shutter 110 can have different "high" and "low" positions relative to chuck 130, wafer 140, or another component in processing module 100. Further, the shape of shutter 110 is not limiting to the illustration of FIGS. 1 and 2, and other shapes are within the spirit and the scope of this disclosure.

According to some embodiments, when shutter 110 is raised, as shown in FIG. 1, a gap D is formed between upper wall portion 150A and shutter 110. In some embodiments, an "optimal" value for gap D that ranges from about 0.5 mm to about 1 mm ensures that shutter 110, when raised, does not come in contact with upper wall portion 150A. However, over time, gap D may decrease when, for example, individual components of assembly 120 wear down. By way of example, when gap D becomes zero, shutter 110 begins to contact upper wall portion 150A when it moves into the high position (e.g., shown in FIG. 1). In some embodiments, the unintentional contact between, for example, upper wall portion 150A and shutter 110 can generate particles that can be detected on wafer 140 in a downstream inspection operation. In some embodiments, shutter 110, when deviating from its intended position, can come into contact with other components of processing module 100 as opposed to upper wall portion 150A. Upper wall portion 150A is used herein as an example and is not limiting.

In some embodiments, the replacement of worn component in assembly 120 can reset gap D to its optimal range, for example, between about 0.5 mm to about 1 mm, so that shutter 110 does not come in contact with upper wall portion 150A when it moves between and the low and high positions shown in FIGS. 2 and 1, respectively. The aforementioned optimal range is exemplary and not limiting. For example, other processing modules and shutter configurations may have different optimal ranges.

Figure 3:
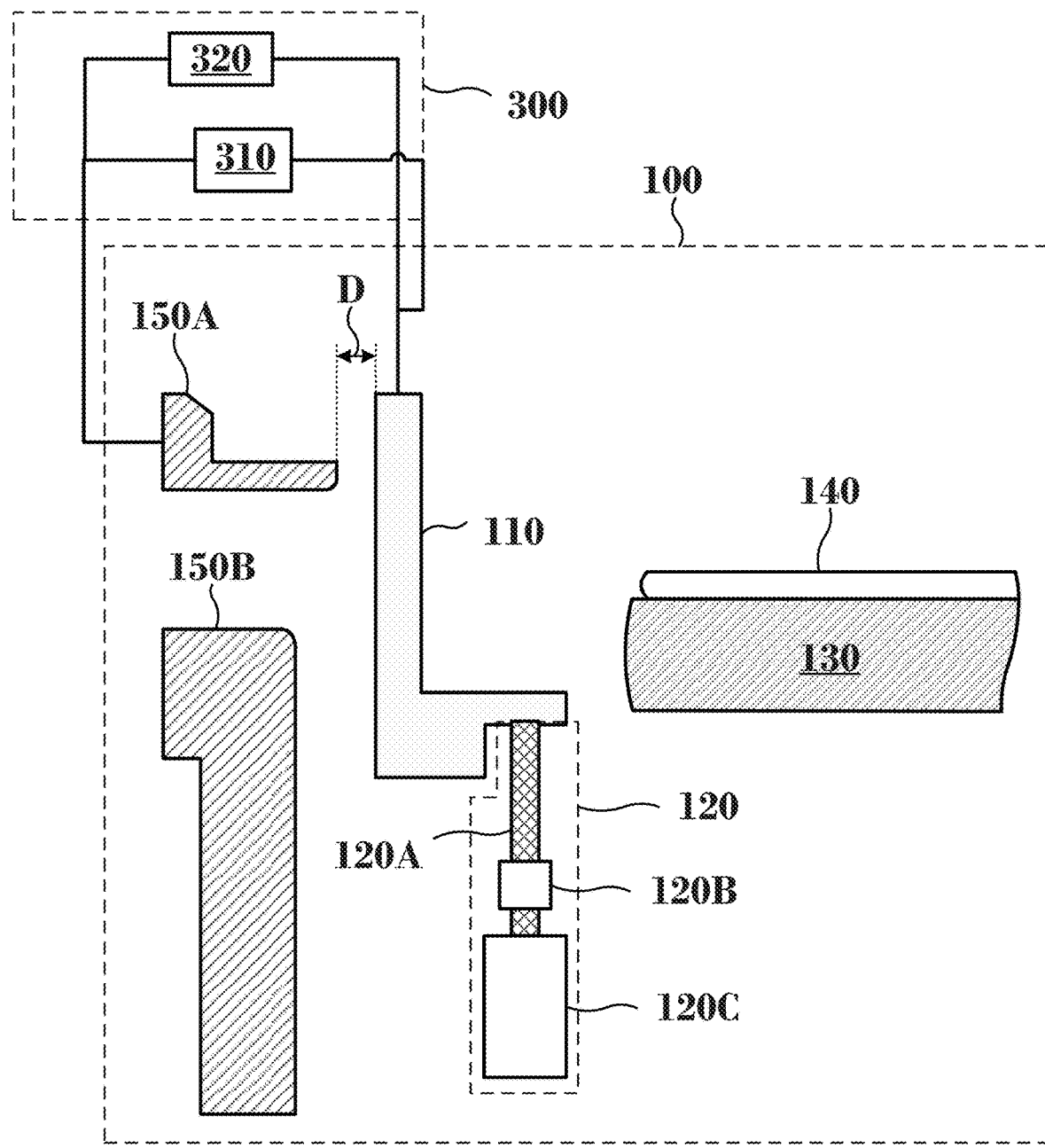
FIG. 3 is a partial view of a processing module with a preventative system that includes a circuit with a voltmeter and a power supply, according to some embodiments.

In some embodiments, a circuit with a power supply and a voltmeter can be used to monitor gap D. By way of example, FIG. 3 shows such an arrangement, where a circuit 300 includes an electrode connected to upper wall portion 150A and another electrode connected to shutter 110. In some embodiments, upper wall portion 150A can serve as a reference point from which the distance to shutter 110 can be measured and monitored using circuit 300. According to some embodiments, circuit 300 includes a power supply 310 and a voltmeter 320, which are both connected in parallel to a capacitor formed by upper wall portion 150A and shutter 110. By way of example, each of the upper wall portion 150A and shutter 110 can serve as the plates of the formed capacitor with a gap or distance D between them. Further, circuit 300 can be configured so that power supply 310 and voltmeter 320 can be independently connected and disconnected from circuit 300 through electrical switches, which are not shown in FIG. 3 for simplicity. In some embodiments, upper wall portion 150A and shutter 110 are electrically isolated from one another (e.g., they are not electrically connected to the same voltage potential, such as a ground reference voltage).

In some embodiments, a voltage readout from voltmeter 320 can be calibrated to correspond to gap, or spacing, D between upper wall portion 150A (e.g., the reference point) and shutter 110. By way of example, this can be done as follows. For a known value of gap D (e.g., 1 mm) and with voltmeter 320 disconnected and power supply 310 connected to circuit 300, the capacitor formed by upper wall portion 150A and shutter 110 can be charged with a charge Q. Subsequently, with power supply 310 disconnected and voltmeter 320 connected to circuit 300, a voltage corresponding to stored charge in the capacitor is measured across the plates of the capacitor. More specifically, the measured voltage will be proportional to the charge Q stored in the capacitor and gap D between the plates of the formed capacitor (e.g., upper wall portion 150A and shutter 110), according to the capacitor formula below:

$$\Delta V = Q \cdot D / (\varepsilon_o \cdot A),$$

where $\Delta V$ is the voltage difference measured across the plates of the capacitor by voltmeter 320, Q is the charge stored in the capacitor, D is the gap between the plates of the capacitor, $\varepsilon_o$ is the dielectric constant of free space, and A is the area of between the plates of the capacitor. As gap between upper wall portion 150A and shutter 110 decreases over time, the voltage measured by voltmeter 320 decreases in response to the change in gap distance. This is because the other parameters of the formula remain unchanged. The method described above can be used for several known values of gap D (e.g., for 0.8 mm, 0.6 mm, 0.5 mm, 0.2 mm, etc.) to obtain a calibration curve or table that shows the relationship between the voltage measured by voltmeter 320 and corresponding gap D between upper wall portion 150A and shutter 110. Therefore, at any given time, the voltage reading from voltmeter 320 in circuit 300 can be converted to a value for gap D.

In some embodiments, a galvanometer or an ammeter can be used instead of a voltmeter in circuit 300. The galvanometer or the ammeter can be connected in series with respect to the capacitor formed by upper wall portion 150A and shutter 110. Accordingly, following the same methodology described above, power supply 310 charges the capacitor to a fixed voltage, the capacitor is disconnected from power supply 310, and the ammeter or galvanometer is used to measure a discharge current. The discharge current can correspond to a gap, or spacing, D between upper wall portion 150A and shutter 110.

In some embodiments, circuit 300 can include a capacitance meter configured to measure capacitance between upper wall portion 150A and shutter 110 as a function of distance D. For example, in circuit 300, voltmeter 320 and power supply 310 can be replaced with a capacitance meter, in which a terminal of the capacitance meter electrically connects to upper wall portion 150A and another terminal of the capacitance meter electrically connects to shutter 110.

FIG. 3 includes selected portions or elements of circuit 300 and additional elements may not be shown. By way of example, the additional elements can include electrical components, such as transistors, resistors, signal amplifiers, digital controllers, input and output ports, connection ports, antennas, network and interface cards, logic circuits configured to perform comparisons and computations, other power supplies, etc. In some embodiments, circuit 300 can be part of an electronic unit configured to use a voltmeter, a galvanometer, an ammeter, another electronic device, or combinations thereof to provide a correlation between an electrical signal (e.g., digital or analog, voltage and/or current, capacitance, etc.) and a gap, or spacing, D between upper wall portion 150A and shutter 110.

Figure 4:
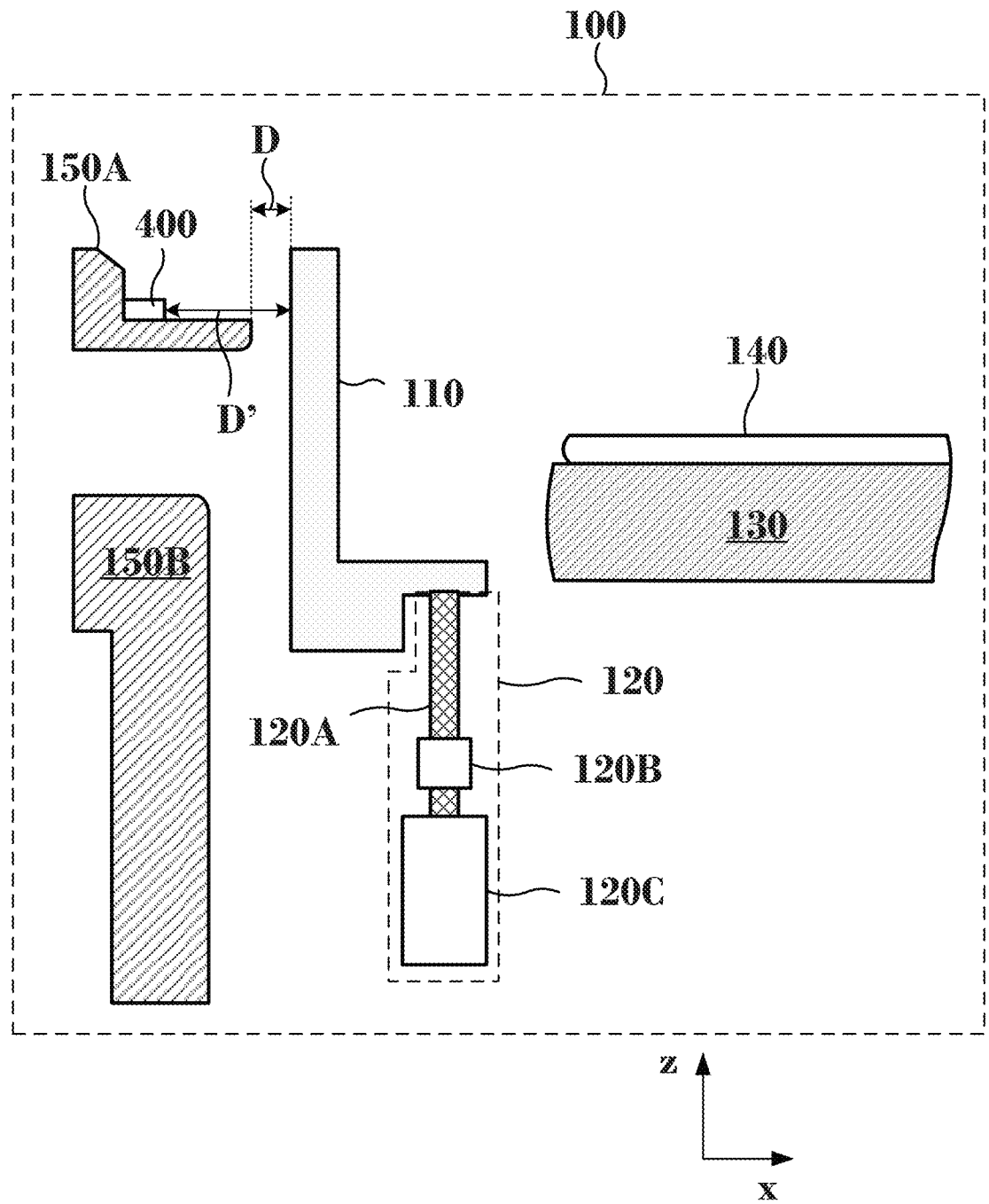
FIG. 4 is a partial view of a processing module with a preventative system that includes a sensor, according to some embodiments.

In some embodiments, alternative ways to measure and monitor distances, such as gap D, can be employed. By way of example, devices that can be used include optical sensors (e.g., a camera, infrared sensors, and laser distance sensors), ultrasonic sensors (e.g., a reverse radar sensor), an inductive proximity sensor, or any other type of sensor that can determine a distance between two objects (e.g., between upper wall portion 150A and shutter 110). By way of example, the above mentioned sensors can be attached to upper wall portion 150A and be configured to monitor the distance between upper wall portion 150A and shutter 110 (e.g., gap D). FIG. 4 shows such an arrangement, where sensor 400 is attached to upper wall portion 150A and configured to measure or monitor gap D', from which gap D can be calculated. In some embodiments, gap D' corresponds to the distance between sensor 400 and shutter 110. The location of sensor 400 on upper wall portion 150A is not limited to the depiction in FIG. 4. For example, the placement of sensor 400 may depend on factors such as the geometry of upper wall portion 150A, the size of sensor 400 with respect to upper wall portion 150A, or the type of sensor. Sensor 400 may not be installed on upper wall portion 150A adjacent to shutter 110. For example, an optical sensor, such as a camera, may be installed such that it views upper wall portion 150A and shutter 110 from the side; or sensor 400 may be installed in a diametrically opposite direction from upper wall portion 150A as long as shutter 110 is in the line of sight of sensor 400.

In some embodiments, sensor 400 can communicate with a control unit or a computer outside processing module 100 either via a wired or wireless communication means. Therefore, sensor 400 can be part of a distance-detection system that includes additional electronic components not shown in FIG. 4. In some embodiments, sensor 400 can be configured to provide a distance measurement value so that gap D between upper wall portion 150A and shutter 110 can be determined.

Figure 5:
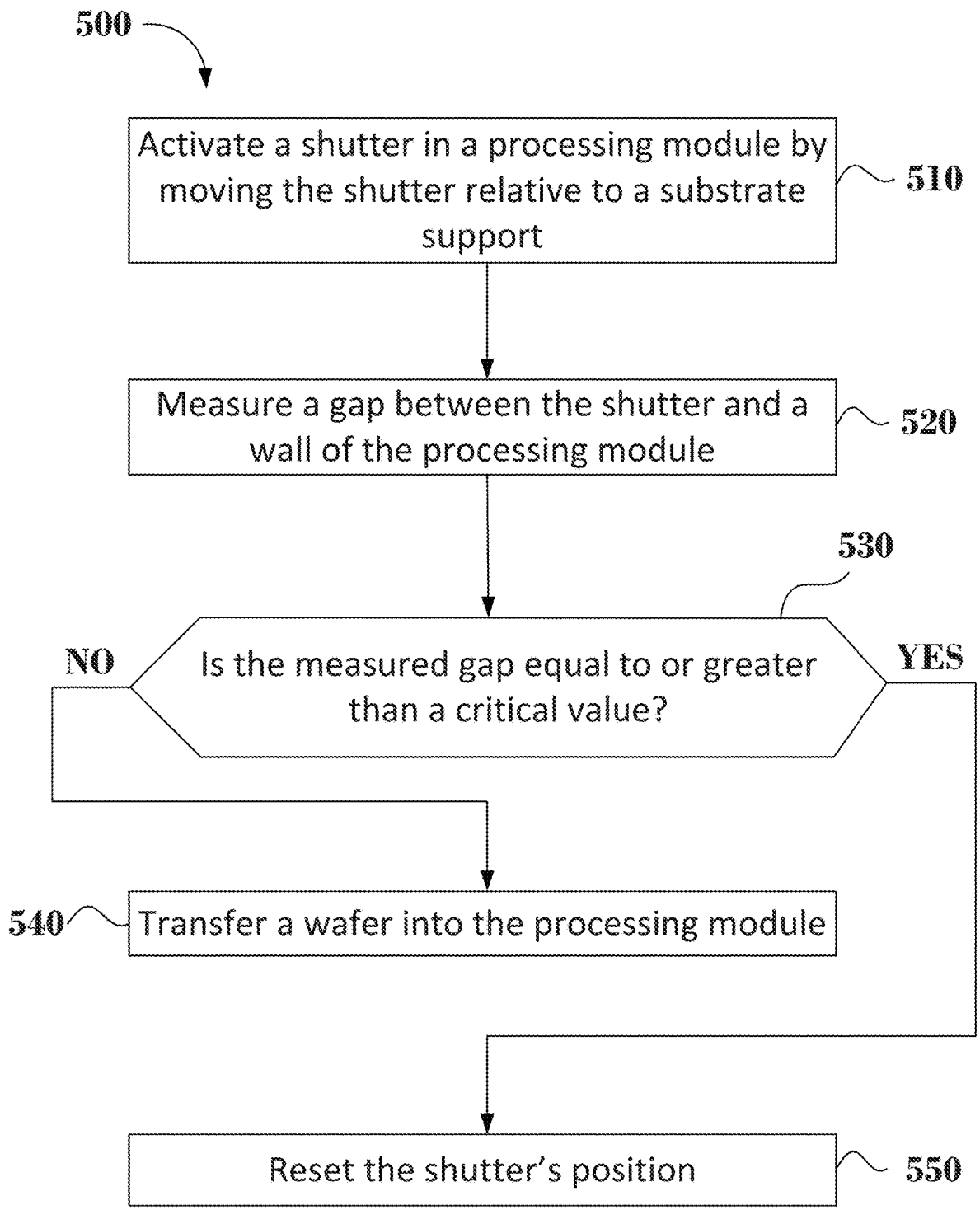
FIG. 5 is a flow chart of a method that describes the use of a detection system in a processing module to monitor shutter movement, according to some embodiments.

FIG. 5 is a flow chart of a method 500 for monitoring a shutter's movement in a processing module. This disclosure is not limited to this operational description and other operations are within the spirit and scope of the present disclosure. It is to be appreciated that additional operations may be performed. Moreover, not all operations may be needed to perform the disclosure provided herein. Additionally, some of the operations shown in FIG. 2 may be performed simultaneously or in a different order. In some implementations, one or more other operations may be performed in addition to, or in place of, the presently described operations. For illustrative purposes, method 500 will be described with reference to the embodiments shown in FIGS. 1 and 4.

In referring to FIG. 5, method 500 begins with operation 510, where a shutter is activated by moving the shutter relative to a substrate support. The shutter can be activated or deactivated by changing its position relative to the position of a substrate (e.g., wafer) and/or substrate support (e.g., chuck). By way of example, the shutter can be activated when it is raised relative to the position of a wafer/substrate support, and deactivated when it is lowered relative to the position of the wafer/substrate support. FIG. 2 describes an example initial position of shutter 110, and FIG. 1 describes an example final position of shutter 110 after activation (e.g., after operation 510 of method 500).

In FIG. 1, shutter 110 is proximate to upper wall portion 150A of processing module 100. According to some embodiments, at this position, a gap or spacing D is formed between upper wall portion 150A and shutter 110. In some embodiments, an optimal gap or spacing between upper wall portion 150A and shutter 110 ensures that shutter 110 does not come into contact with upper wall portion 150A when it moves between the positions shown in FIGS. 1 and 2. By way of example, an optimal gap or spacing D can range from about 0.5 mm to about 1 mm. However, this gap D is not limiting and other optimal values for gap D are possible depending on the geometry of shutter 110 and processing module 100. In some embodiments, the rubbing action between upper wall portion 150A and shutter 110 can generate particles that can be detected on wafer 140 (e.g., in a downstream inspection operation).

In other embodiments, when shutter 110 deviates from its intended vertical path (e.g., along the z-direction), it can be in contact with other components of processing module 100 (e.g., not the walls of processing module 100). Thus, upper wall portion 150A is merely used herein is as an example and it is not limiting.

Referring to FIG. 5 and operation 520, gap D is measured between shutter 110 and a wall of the processing module (e.g., upper wall portion 150A of processing module 100). By way of example, gap or spacing D can be measured via circuit 300 shown in FIG. 3. In some embodiments, circuit 300 can include power supply 310 and voltmeter 320, which are both connected in parallel with respect to a capacitor formed by upper wall portion 150A and shutter 110. Additionally, circuit 300 can be configured to connect/disconnect power supply 310 and voltmeter 320 from circuit 300 through electrical switches, which are not shown in FIG. 3. The voltage readout from voltmeter 320 can be calibrated to correspond to a respective gap, or spacing, D between upper wall portion 150A and shutter 110. For example, a voltage measured for a large spacing D (e.g., about 1 mm) between upper wall portion 150A and shutter 110 can be greater than a voltage measured for a small spacing D (e.g., below about 0.5 mm). This is because the different spacing values will correspond to different voltages measured by voltmeter 320 in circuit 300, according to some embodiments.

Alternatively, circuit 300 can include a galvanometer or an ammeter instead of voltmeter 320. Accordingly, following the same methodology described above, a discharge current reading from an ammeter or galvanometer can be calibrated to correspond to a respective gap, or spacing, D between upper wall portion 150A and shutter 110. In some embodiments, the ammeter can be connected in series with respect to the capacitor formed by upper wall portion 150A and shutter 110.

In some embodiments, circuit 300 can include a capacitance meter instead of voltmeter 320 and power supply 310. The capacitance meter can be configured to measure a capacitance between upper wall portion 150A and shutter 110 as a function of distance D.

In some embodiments, the gap between upper wall portion 150A and shutter 110 can be measured with a sensor device (e.g., sensor 400 shown in FIG. 4). By way of example and not limitation, the sensor device can be an optical sensor a camera, infrared sensors, a laser distance sensors), an ultrasonic sensor (e.g., a reverse radar sensor), an inductive proximity sensor, or any other type of sensor that can determine a distance between two objects (e.g., between upper wall portion 150A and shutter 110). By way of example, the above mentioned sensors can be attached to upper wall portion 150A and be configured to monitor the distance between upper wall portion 150A and shutter 110 (e.g., gap D), as shown in FIG. 4.

Referring to FIG. 5 and operation 530 of method 500, a determination is made whether the measured gap is equal to or greater than a "critical" value. The "critical" value can be defined as the minimum acceptable spacing D (e.g., between upper wall portion 150A and shutter 110) that ensures contact-free operation of shutter 110. The critical value can be set, for example, to be at a lower end of the optimal spacing D range (e.g., 0.5 mm). However, this is not limiting and other values can be selected depending on the shutter assembly and processing module. For example, if the measured gap or spacing D between upper wall portion 150A and shutter 110 is equal to or greater than the predetermined critical value, a wafer can be transferred into the processing module for processing, according to operation 540. On the other hand, if the measured gap or spacing D is not equal to or greater than the critical value, the shutter's position is reset, according to operation 550.

Figure 6:
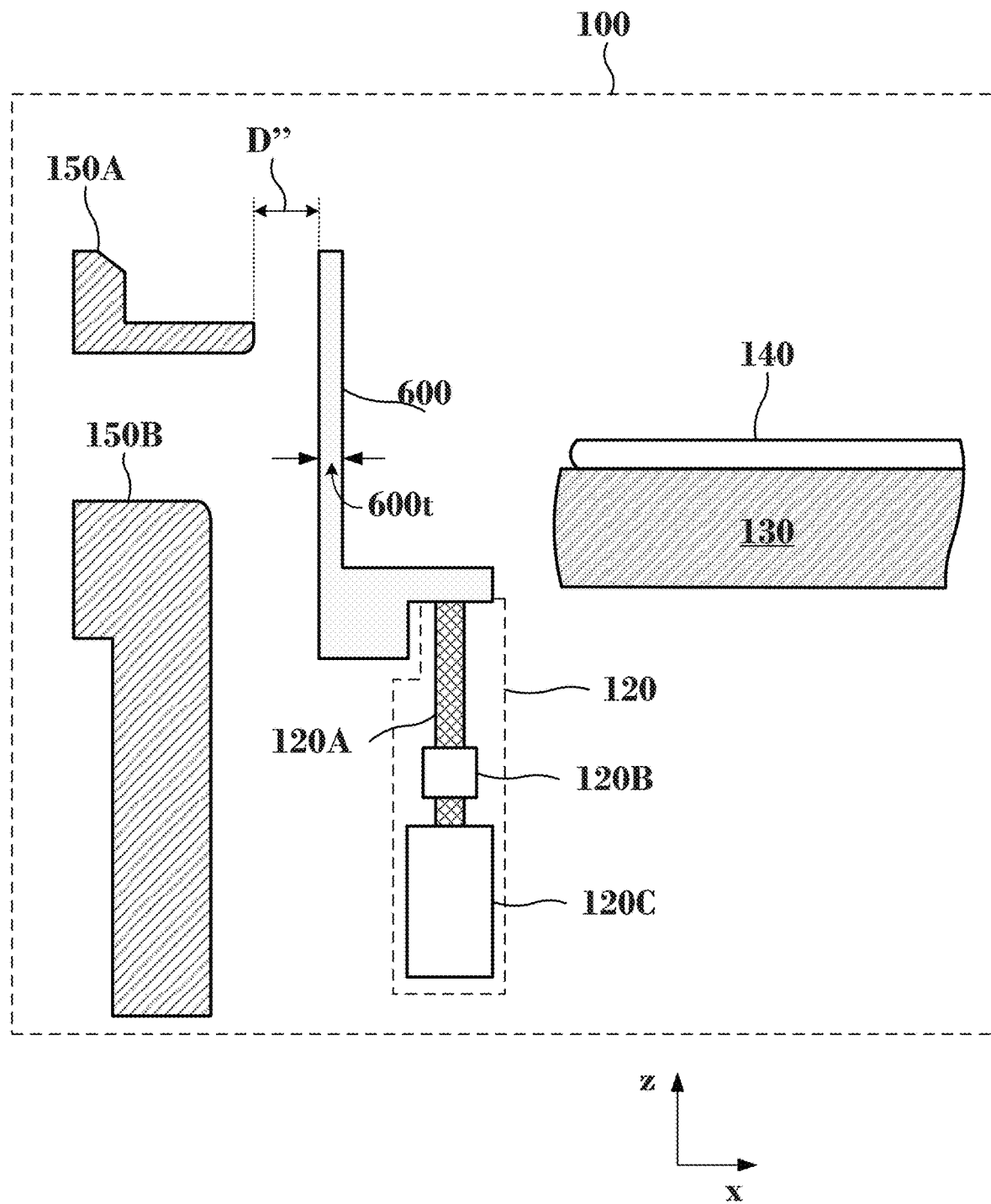
FIG. 6 is a partial view of a processing module with a shutter having a different body thickness, according to some embodiments.

In some embodiments, the position of shutter 110 can be reset by replacing one or more components (e.g., worn components) of the assembly that is responsible for the movement of shutter 110. Such components can be, for example, rod 120A, bearing assembly 120B, cylinder 120C, or combinations thereof. In some embodiments, the whole assembly 120 can be replaced. In other embodiments, instead of replacing worn components of assembly 120, shutter 110 can be replaced with another shutter with a thinner body to increase gap or spacing D between the upper wall portion and the shutter. By way of example, in FIG. 6 shutter 110 has been replaced with a thinner shutter 600t that can increase the gap or spacing between upper wall portion 150A and shutter 110 from D to D", where D<D". By way of example, body thickness 600t of shutter 600 can be about 0.5 mm thinner from the corresponding body thickness of shutter 110. In some embodiments, thinner shutter 600 can extend the life of assembly 120. In other words, shutter 600 can delay the replacement of the worn components of assembly 120. In some embodiments, once the worn component(s) of assembly 120 (or shutter 110) has/have been replaced, gap D (or D") is monitored using operation 520 of method 500.

The embodiments described herein are directed to a preventative method and system that can be used to monitor a distance between a shutter and a reference point in a processing module. The method and system described herein can be used to prevent unintentional contact between the shutter and an adjacent component due to one or more worn components in an assembly that is responsible for the shutter's movement. In some embodiments, the method and system can include a sensor that can monitor the position of the shutter with respect to the reference point (e.g., the wall of the processing module or another component). The sensor can be, for example, an optical sensor (e.g., a camera, an infrared sensor, a laser distance sensor), an ultrasonic sensor (e.g., a reverse radar sensor), an inductive proximity sensor, or another type of sensor that can measure the distance between the shutter and the reference point. In some embodiments, the system can include a circuit with a voltmeter, where the gap between the shutter and the reference point is calculated from a voltage difference measured between the shutter and the reference point. In some embodiments, an ammeter or a galvanometer can be used instead of a voltmeter. Alternatively, a capacitance meter can be used to correlate a capacitance measurement to the distance between the shutter and the reference point. If the measured distance is determined to be below a predetermined value, either the worn component responsible for the shutter's movement is replaced or the shutter can be replaced with another shutter that has a thinner body than the original shutter.

In some embodiments, a wafer processing module includes a substrate support configured to support a wafer, a shutter that is proximal to a component of the wafer processing module and is configured to move with respect to the substrate support, and a measurement device. In the wafer process module the measurement device is configured to measure a capacitance between the shutter and the component of the wafer processing module and to calculate a distance between the shutter and the component of the wafer processing module based on the measured capacitance.

In some embodiments, a method includes moving a shutter relative to a substrate support in a wafer processing module and determining a distance between the shutter and a wall of the wafer processing module with a measurement device. In response to the distance being greater than a value, the method further includes transferring a substrate to the substrate support, and in response to the distance being equal to or less than the value, the method includes resetting the shutter.

In some embodiments, a processing device includes a substrate support, a shutter that is proximal to a component of the processing device and is configured to move with respect to the substrate support. The processing device also includes a measurement device configured to determine a distance between the shutter and the component of the processing module.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A wafer processing module, comprising:
   a first space comprising a substrate support configured to support a wafer;
   a second space comprising a first component, a second component, and an opening between the first and second components;
   a shutter configured to move with respect to the substrate support, wherein the shutter is located between the first and second spaces and configured to block the opening, and proximal to the first component; and
   a measurement device configured to:
      measure a capacitance between the shutter and the first component; and
      calculate a distance between the shutter and the first component based on the measured capacitance.

2. The water processing module of claim 1, wherein the first component comprises an upper wall portion of the wafer processing module.

3. The wafer processing module of claim 1, wherein the measurement device is electrically connected in parallel to a capacitor formed by the shutter and the first component.

4. The wafer processing module of claim 1, wherein the measurement device comprises a first terminal and a second terminal, wherein the first terminal is electrically connected to the shutter and the second terminal is electrically connected to the first component.

5. The wafer processing module of claim 1, wherein the measurement device is a capacitance meter.

6. The water processing module of claim 1, wherein the shutter is at a first position when the shutter is located between the first and second spaces and configured to block the opening, and wherein the shutter is lower than the first component so that the first and second spaces form an open space to move the wafer from the second space to the substrate support within the first space when the shutter is at a second position.

7. The wafer processing module of claim 1, wherein the calculated distance is within a range between about 0.5 mm and about 1 mm.

8. A method, comprising:
   moving a shutter relative to a substrate support in a first compartment of a wafer processing module, wherein the shutter is located between the substrate support and a wall in a second compartment of the wafer processing module, wherein the wall comprises an upper wall portion and a lower wall portion separated by an opening in between;
   determining, in response to the shutter being proximal to the upper wall portion, a distance between the shutter and the upper wall portion with a measurement device, wherein the shutter is located between the first and second compartments and configured to block the opening between the upper and lower wall portions;
   in response to the distance being greater than a value, transferring a substrate to the substrate support; and
   in response to the distance being equal to or less than the value, resetting the shutter.

9. The method of claim 8, wherein resetting the shutter comprises replacing one or more components of a movement assembly configured to move the shutter.

10. The method of claim 8, wherein resetting the shutter comprises replacing the shutter with another shutter with a thinner body than the shutter.

11. The method of claim 8, wherein determining the distance between the shutter and the upper wall portion comprises:
   charging, with a power supply, a capacitor formed by the shutter and the upper wall portion;
   measuring a voltage across the capacitor; and
   converting the measured voltage to the distance between the shutter and the upper wall portion.

12. The method of claim 8, wherein determining the distance between the shutter and the upper wall portion comprises:
   charging, with a power supply, a capacitor formed by the shutter and the upper wall portion;
   measuring, with the measurement device, a charge between the capacitor; and
   converting the measured charge to the distance between the shutter and the upper wall portion.

13. The method of claim 8, wherein the measurement device comprises an optical sensor, an ultrasonic sensor, or an inductive proximity sensor.

14. A processing device, comprising:
   a substrate support configured to support a wafer within a first space;
   a first component, a second component, and an opening between the first and second components, wherein the first component, the second component, and the opening are in a second space;
   a shutter configured to move with respect to the substrate support, wherein the shutter is located between the first and second spaces and configured to block the opening, and proximal to the first component; and
   a measurement device configured to determine a distance between the shutter and the first component.

15. The processing device of claim 14, wherein the measurement device comprises an optical sensor, an ultrasonic sensor, or an inductive proximity sensor.

16. The processing device of claim 15, wherein the optical sensor comprises an infrared sensor or a laser sensor.

17. The processing device of claim 15, wherein the optical sensor comprises a camera.

18. The processing device of claim 15, wherein the ultrasonic sensor comprises a reverse radar sensor.

19. The processing device of claim 14, wherein the distance ranges between about 0.5 mm and about 1 mm.

20. The processing device of claim 14, wherein the first component comprises an upper wall portion of the processing device.

* * * * *